(12) United States Patent
Weichslberger et al.

(10) Patent No.: US 8,789,271 B2
(45) Date of Patent: Jul. 29, 2014

(54) METHOD FOR INTEGRATING AN ELECTRONIC COMPONENT INTO A PRINTED CIRCUIT BOARD

(75) Inventors: Günther Weichslberger, Graz (AT); Arno Kriechbaum, Leoben (AT); Mike Morianz, Graz (AT); Nikolai Haslebner, Zeltweg (AT); Johannes Stahr, Bruck (AT); Fritz Haring, Bruck (AT); Gerhard Freydl, Leoben (AT); Andrea Koertvelyessy, Vienna (AT); Mark Beesley, Leoben (AT); Andreas Zluc, Fußach (AT); Wolfgang Schrittwieser, Kapfenberg (AT)

(73) Assignee: AT & S Austria Technologies & Systemtechnik Aktiengesellschaft, Leoben-Hinterberg (AT)

( * ) Notice: Subject to any disclaimer, the term of this patent is extended or adjusted under 35 U.S.C. 154(b) by 662 days.

(21) Appl. No.: 12/736,942
(22) PCT Filed: May 29, 2009
(86) PCT No.: PCT/AT2009/000224
§ 371 (c)(1), (2), (4) Date: Nov. 24, 2010
(87) PCT Pub. No.: WO2009/143550
PCT Pub. Date: Dec. 3, 2009

(65) Prior Publication Data
US 2011/0069448 A1 Mar. 24, 2011

(30) Foreign Application Priority Data
May 30, 2008 (AT) ............... GM 313/2008

(51) Int. Cl.
H05K 3/30 (2006.01)
(52) U.S. Cl.
USPC .......... 29/841; 29/832; 29/846; 438/127
(58) Field of Classification Search
USPC .......... 29/830, 832, 834, 841, 846, 851, 852; 174/260, 262; 438/107, 127; 361/704
See application file for complete search history.

(56) References Cited

U.S. PATENT DOCUMENTS

| | | | | |
|---|---|---|---|---|
| 5,373,627 | A * | 12/1994 | Grebe | 29/841 |
| 6,931,725 | B2 * | 8/2005 | Sugaya et al. | 29/852 |
| 7,362,576 | B2 * | 4/2008 | Takeda et al. | 361/704 |
| 7,727,802 | B2 * | 6/2010 | Sunohara et al. | 438/107 |
| 8,101,868 | B2 * | 1/2012 | Ito et al. | 174/260 |
| 2005/0017347 | A1 * | 1/2005 | Morimoto et al. | 257/703 |
| 2005/0112798 | A1 | 5/2005 | Bjorbell | |

FOREIGN PATENT DOCUMENTS

| | | |
|---|---|---|
| JP | 2004-200201 | 7/2004 |
| JP | 2007-150202 | 6/2007 |
| JP | 2007-288109 | 11/2007 |

(Continued)

*Primary Examiner* — Donghai D Nguyen
(74) *Attorney, Agent, or Firm* — Jacobson Holman, PLLC.

(57) ABSTRACT

This publication discloses a circuit-board construction and a method for manufacturing an electronic module, in which method at least one component (6) is embedded inside an insulating-material layer (1) and contacts (14) are made to connect the component (6) electrically to the conductor structures (14, 19) contained in the electronic module. According to the invention, at least one thermal via (22), which boosts the conducting of heat away from the component (6) is manufactured in the insulating-material layer (1) in the vicinity of the component (6).

13 Claims, 4 Drawing Sheets

(56) References Cited

FOREIGN PATENT DOCUMENTS

| WO | 03/065778 | 8/2003 |
| WO | 03/065779 | 8/2003 |
| WO | 2004/077902 | 9/2004 |
| WO | 2005/104635 | 11/2005 |
| WO | 2007/087660 | 8/2007 |

* cited by examiner

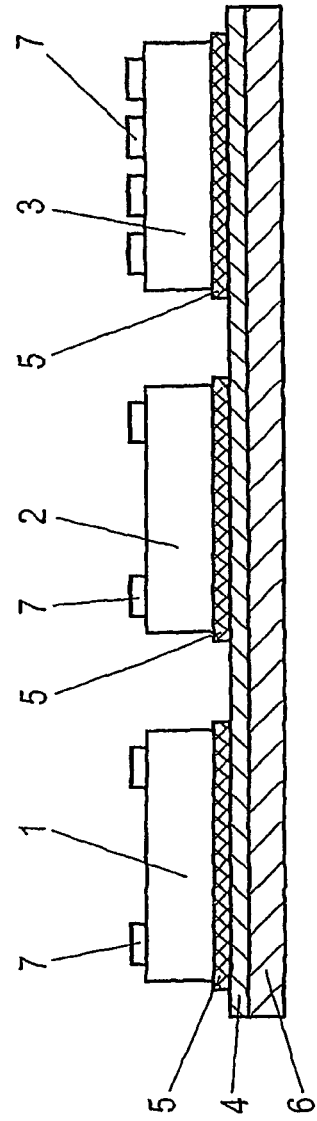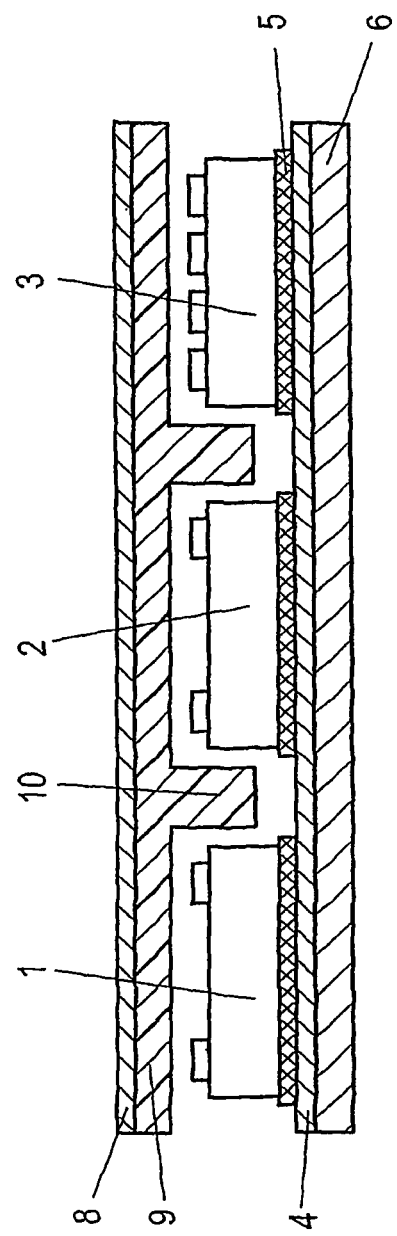

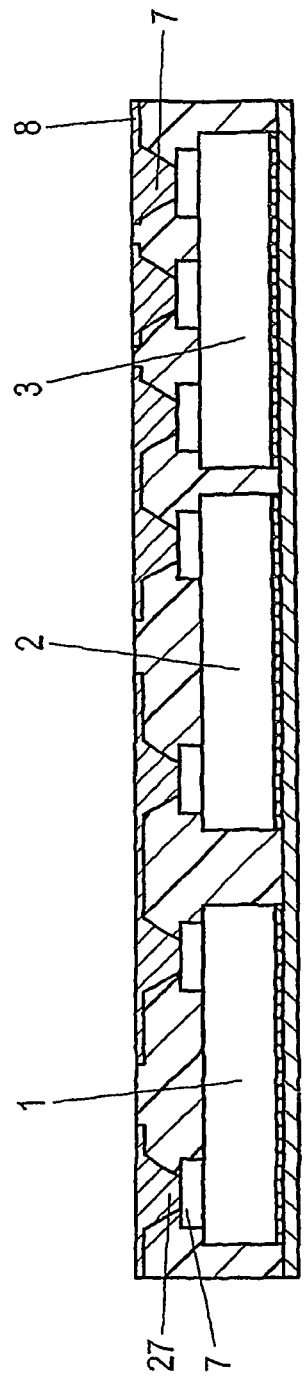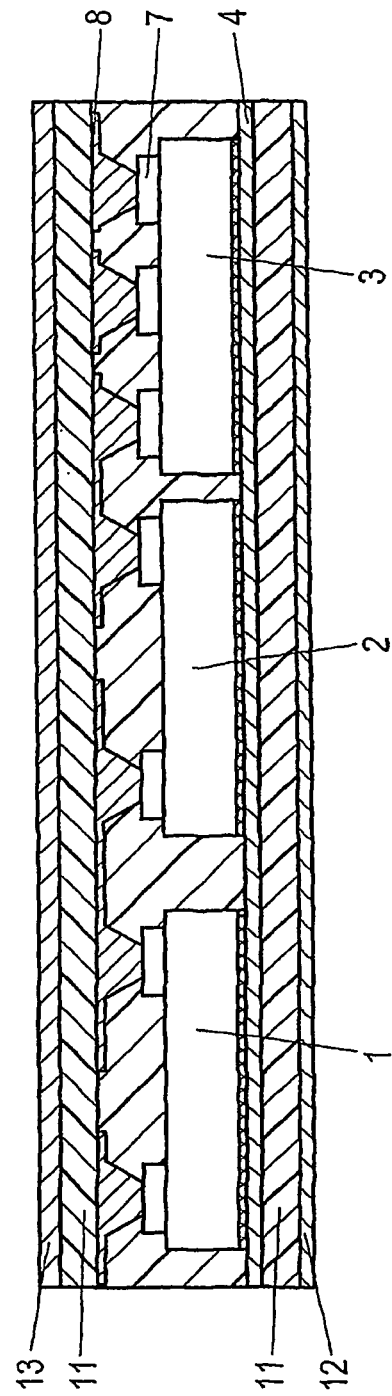

METHOD FOR INTEGRATING AN ELECTRONIC COMPONENT INTO A PRINTED CIRCUIT BOARD

This is a national stage of PCT/AT2009/000224 filed May 29, 2009 and published in German, which has a priority of Austria no. GM 313/2008 filed May 30, 2008, hereby incorporated by reference.

FIELD OF THE INVENTION

The present invention relates to a method for integrating at least one electronic component into a printed circuit board as well as a printed circuit board including at least one integrated electronic component.

PRIOR ART

The invention further relates to a printed circuit board including at least one integrated electronic component, comprising a layer for supporting the electronic component, to which the at least one electronic component is fixed by means of an adhesive, wherein, after the fixation of the electronic component, at least one electrically conductive layer is arranged on or at the component and patterned in accordance with the contacts of the electronic component and/or conductor tracks of the printed circuit board.

In the context of growing product functionalities of apparatus provided with electronic components and the increasing miniaturization of such electronic components as well as the increasing number of electronic components to be loaded on printed circuit boards, efficient field-likely or array-likely configured components or packages including several electronic components are used to an increasing extent, which comprise a plurality of contacts and connections at increasingly reduced distances between said contacts. For fixing or contacting such components, the use of strongly disentangled printed circuit boards is increasingly required, wherein it is to be anticipated that, with the simultaneous reduction of the product sizes as well as the components and printed circuit boards to be used, it is to be expected, both in terms of the thicknesses and in terms of the surfaces of such elements, that the loading or arrangement of such electronic components via the required plurality of contact pads on printed circuit boards will become problematic, reaching the limits of the possible pattern definition of such contact pads.

To solve these problems, it has so far been proposed to integrate electronic components at least partially into a printed circuit board, reference being, for instance, made to WO 03/065778, WO 03/065779 or WO 2004/077902. Those known methods and embodiments of electronic components or components integrated in a printed circuit board, however, involve the drawback that recesses or holes are each to be provided in a base element of a printed circuit board for receiving such electronic components or components, wherein conductor tracks are additionally formed prior to the arrangement of a component in such a hole. For contacting the components, soldering processes and bonding techniques are used, usually resulting in contact sites or contact pads between materials of different types between elements of the conductor tracks and the contact sites or junctions of the electronic components. Particularly when using such systems in environments affected by great temperature differences and regions with variable temperatures, mechanically and thermally induced tensions will be created due to the use of different materials in the region of the contact sites or junctions considering the different thermal expansion coefficients, which tensions may lead to a crack of at least one contact site or junction, and hence to a failure of the component. Moreover, it is to be anticipated that bores, particularly laser bores, additionally required for the production of contact surfaces will stress the components. Furthermore, it is disadvantageous that contacting or bonding of the components embedded in the recesses or depressions to be produced, on conductor tracks and contact surfaces by solder pastes or bonding wires will be complicated and, in particular, will not be reliably achievable when used under varying temperature stresses. In addition, it is disadvantageous that the high pressures and temperatures to be provided, if necessary, during the printed circuit board production process will stress the embedded and contacted components. Furthermore, problems will arise in the removal or dissipation of heat from possibly more strongly stressed electronic.

SUMMARY OF THE INVENTION

The present invention thus aims to eliminate, or at least strongly reduce, the above-mentioned problems involved in the integration of at least one electronic component into a printed circuit board, aiming, in particular, at providing a method of the initially defined kind, as well as a printed circuit board, in which, with a simplified process course, an enhanced reliability of the arrangement and fixation and the contacting of at least one electronic component in a printed circuit board will be achieved.

To solve these objects, a method for integrating at least one electronic component into a printed circuit board substantially comprises the following steps:
  providing a layer of a printed circuit board for supporting the electronic component,
  applying an adhesive to a surface of the layer,
  fixing the electronic component on the layer by means of the adhesive,
  applying or arranging at least one electrically conductive layer on or at the component, on the side or surface remote from the adhesive, and
  patterning the electrically conductive layer in accordance with the contacts of the electronic component and/or in accordance with conductor tracks to be formed on the printed circuit board.

According to the invention the application and fixation of the at least one electronic component on a layer of a printed circuit board for supporting the electronic component are provided, whereby, as opposed to the initially mentioned prior art, the previous formation of depressions or recesses for receiving the electronic component, and the previous formation of contact sites or conductor tracks to be arranged in accordance with the contacts of the electronic component to be received, can be obviated. According to the invention, a great simplification in the context of the arrangement and positioning of the at least one electronic component to be integrated into the printed circuit board is thus provided such that cumbersome positioning steps or preparation steps for the production of a reception opening for the electronic component can be renounced. Following the arrangement and fixation of the electronic component on the layer for supporting the electronic component, the application or arrangement of at least one electrically conductive layer is effected on or at the component, on its side or surface remote from the adhesive and comprising the contacts or junctions of the electronic component to be integrated, whereupon patterning of this electrically conductive layer is effected in accordance with the contacts of the electronic component as well as a connection therewith, and/or in accordance with conductor tracks to be formed on the printed circuit board. Such a formation or patterning or structuring of the electrically conductive layer after the arrangement and fixation of the component will ease the precise method steps required for proper contacting, since the required bondings and/or conductor tracks can be realized or formed in a manner coordinated with the already fixed electronic component. By the application or arrangement according to the invention of the electrically conductive layer on or at the component, which also involves contacting with the contact pads of the electronic component, elaborate and, considering the increasingly decreasing distances of such contacts or junctions of the electronic component, growingly complicated contacting or bonding methods using, for instance, soldering or galvanic or bonding processes, can, moreover, be largely renounced, or such processes can be performed in a simplified manner after the application or fixation of the electrically conducting or conductive layer and its patterning. Since the invention provides that the patterning or structuring of the electrically conductive layer of the printed circuit board in accordance with the contacts or junctions of the electronic component and/or the conductor tracks to be produced in the electrically conductive layer is performed only after the fixation of the at least one electronic component and the arrangement of the electrically conducting or conductive layer, the high demands in view of a precise positioning of the electronic component relative to the already formed contact surfaces or conductor tracks of the printed circuit board can be renounced as opposed to known methods and configurations. It is possible by simple means to determine the position of the electronic component after its fixation on the layer by means of the adhesive, whereupon the arrangement and patterning of the conductive layer of the printed circuit board can be carried out in a simple and precisely positionable manner.

In order to provide a substantially plane locating surface for the at least one electrically conductive layer to be applied or arranged after the fixation of the electronic component, and in order to ensure the proper and safe as well as protected embedding of the at least one electronic component in the interior of the printed circuit board, it is proposed according to a preferred embodiment that the electronic component, after having been fixed to the layer, is surrounded by an insulating material, in particular a prepreg film and/or a resin.

Since the printed circuit board layer which is to be connected with the at least one electronic component to be integrated in the printed circuit board and forms an abutment or supporting surface for the component to be integrated has optionally an extremely small thickness, it is proposed according to a further preferred embodiment that the layer for supporting the electronic component is applied on a carrier layer or core prior to applying the adhesive. Such a carrier layer provides a sufficiently stable base during the application of the adhesive and the subsequent fixation of the at least one electronic component and, if required, can be readily removed again prior to the patterning procedure of the electrically conductive layer, which is required after the fixation of the electronic component, as in correspondence with a further preferred embodiment of the method according to the invention.

For the proper fixation of the at least one electronic component to be integrated, it is proposed according to a further preferred embodiment that the adhesive is applied to the surface of the layer in a pattern matched with the arrangement of the electronic component to be fixed. It is thereby avoided that, in particular for the further construction of the printed circuit board, the adhesive, if necessary, will subsequently have to be removed again in a cumbersome procedure in those regions in which no fixation of the at least one electronic component has been effected. The adhesive can be applied by application methods known per se, e.g. by screen-printing, roll-coating, spreading or the like. After having arranged or applied the at least one electronic component to be integrated, the adhesive may optionally be cured by a curing treatment, for instance by the application of heat and/or an irradiation with electromagnetic radiation of a given wavelength. Alternatively, a curable and, in particular, photo-active adhesive film may, for instance, be provided for the fixation of the electronic component to be integrated, which adhesive film is, for instance, subjected to appropriate curing, particularly photo-processing, after the arrangement of the electronic component.

As already indicated above, the method according to the invention provides the patterning of at least one electrically conductive layer after the fixation and contacting of the at least one electronic component to be integrated, wherein, in this connection, it is proposed according to a preferred embodiment that patterning of the conductive layer is performed by laser patterning, photo-patterning or the like. Such patterning procedures are known per se and allow for the precise formation of the contact regions as well as the adjoining conductor tracks in the region of the electrically conductive or conducting layer connected or to be connected with the at least one electronic component.

In known configurations and methods for integrating at least one electronic component into a printed circuit board, it is to be anticipated as already indicated above that the printed circuit board and, in particular, conductor-track-defining layers are completed to the greatest extent possible, whereupon the at least one electronic component is arranged in an appropriate depression or recess and subsequently contacted in a cumbersome process. By contrast, according to the invention, further structuring or finishing of the printed circuit board takes place after the fixation of the at least one electronic component, wherein, after patterning of the electrically conductive layer following the fixation of the at least one electronic component, a further preferred embodiment of the method according to the invention contemplates that, after patterning of the conductive layer, at least one insulating layer is applied on the surface of the patterned conductive layer remote from the electronic component.

In the context of the completion of the printed circuit board comprising at least one electronic component integrated by the method according to the invention, it is, moreover, proposed that at least one conducting and/or non-conducting layer, for instance an RCC foil, is additionally applied or arranged, as in correspondence with a further preferred embodiment of the method according to the invention. Such RCC (resin coated copper) foils are known per se and, after proper contacting of the at least one electronic component with the electrically conductive layer, can be used for further completing the printed circuit board, or are used directly in connection with the arrangement and fixation of the electrically conductive layer following the fixation of the electronic component.

For the removal or dissipation of heat generated in possibly strongly stressed electronic components, it is provided according to a further preferred embodiment that, on the side of the electronic component remote from the electrically conductive layer, particularly in the region of fixation of the electronic component, at least one opening is formed for the removal of heat and/or for contacting the component.

For further improving the dissipation of heat, or distributing the heat possibly spot-wisely generated within the electronic component, it is proposed according to a further preferred embodiment that the layer for supporting the electronic component is formed by a metallic and, in particular, electrically conductive layer.

In the context of assisting the dissipation of heat, or distribution of possible spots under high thermal load, especially in subregions of the electronic component to be embedded or integrated, it is proposed according to a further preferred embodiment that a thermally conducting or conductive adhesive is used.

In order to further increase the number of contacts or junctions of an electronic component to be integrated, it is proposed according to a further preferred embodiment of the method according to the invention that an electronic component is used, which, on opposite main surfaces, is each provided with a plurality of contacts to be contacted with the electrically conductive layers. By using an electronic component which is each provided with a plurality of contacts on its opposite main surfaces, the number of contacts or junctions can be increased, wherein it is preferred in this context, as already proposed above in connection with an improved heat dissipation or distribution, that also the component-supporting layer, which is provided with the adhesive for fixing the electronic component, is formed by an electrically conductive or conducting layer.

According to the method of the invention, it is, moreover, proposed in a preferred manner that the electronic component is tested for its functionality immediately upon patterning of the electrically conductive layer. Such a check of the functionality of the electronic component immediately upon patterning of the electrically conductive layer following the connection of the junctions or contact pads of the electronic component with the electrically conductive layer will also immediately allow for a check or test in regard to the correctness or completeness of the realized contactings such that, as opposed to known method controls, the functionality or proper contacting of the at least one electronic component can already be verified at an earlier time, and defective elements can already be discarded at an earlier time during the process course, thus strongly reducing the rejects and costs resulting from incorrect contacting.

To solve the initially mentioned objects, a printed circuit board including at least one integrated electronic component substantially comprises a layer for supporting the electronic component, to which the at least one electronic component is fixed by means of an adhesive, wherein, after the fixation of the electronic component, at least one electrically conductive layer is capable of being arranged on or at the component and patterned in accordance with the contacts of the electronic component and/or conductor tracks of the printed circuit board. As already indicated above, it is thus possible to achieve simple and reliable contacting of the contact sites or junctions of the at least one electronic component with an electrically conductive layer of a printed circuit board, whereby expensive additional contacting methods including the previous formation of bores or passages that are to be precisely arranged can be obviated. After the fixation of the at least one electronic component to the printed circuit board, it is, moreover, possible to provide or achieve simple and reliable patterning in reference to the already fixed electronic component.

To provide for a reliable insulation and mechanical stability as well as a protection of the component to be integrated, it is, moreover, preferably provided that the electronic component is surrounded by an insulating material, in particular a prepreg film and/or an insulating resin.

For the further completion of the printed circuit board according to the invention, it is, moreover, contemplated that a plurality of layers embedding the component and made of insulating and/or conductive materials are provided, as in correspondence with a further preferred embodiment of the printed circuit board according to the invention.

To carry off heat from possibly more highly stressed electronic components, it is, moreover preferably provided that at least one opening for the removal of heat is provided in the particularly insulating material surrounding and/or supporting the electronic component, particularly in the region of fixation of the electronic component.

SHORT DESCRIPTION OF THE DRAWINGS

In the following, the invention will be explained in more detail by way of exemplary embodiments schematically illustrated in the drawing, of a printed circuit board according to the invention using the method according to the invention. Therein:

FIG. 1 is a schematic illustration of the first method step of the method according to the invention for producing a printed circuit board according to the invention, wherein a plurality of electronic components are applied on a supporting layer;

FIG. 2 is a schematic illustration of a further method step of applying or arranging at least one electrically conductive layer;

Figure 5:
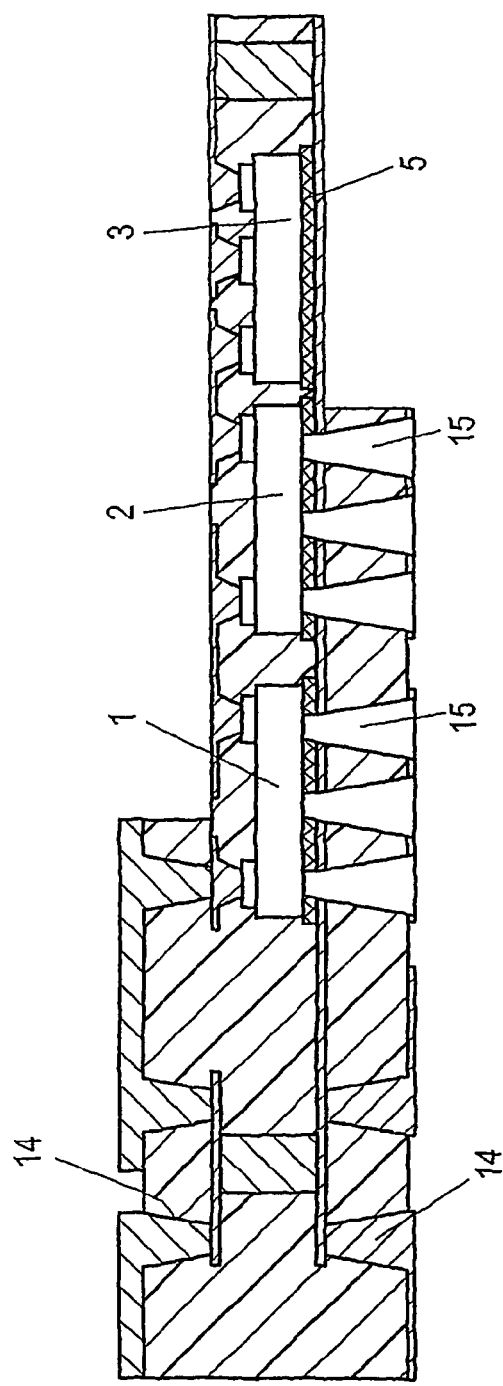
Figure 6:
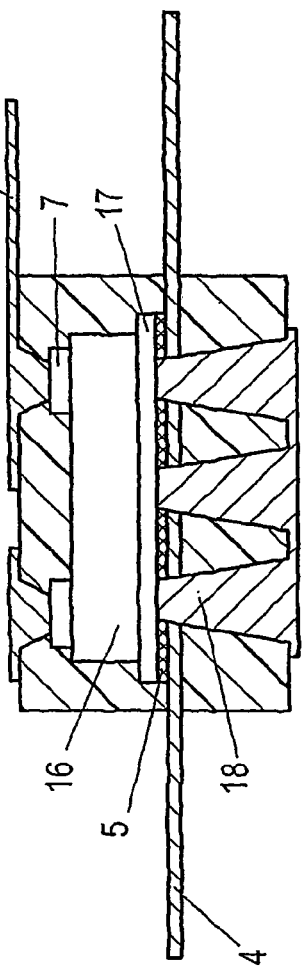
Figure 7:
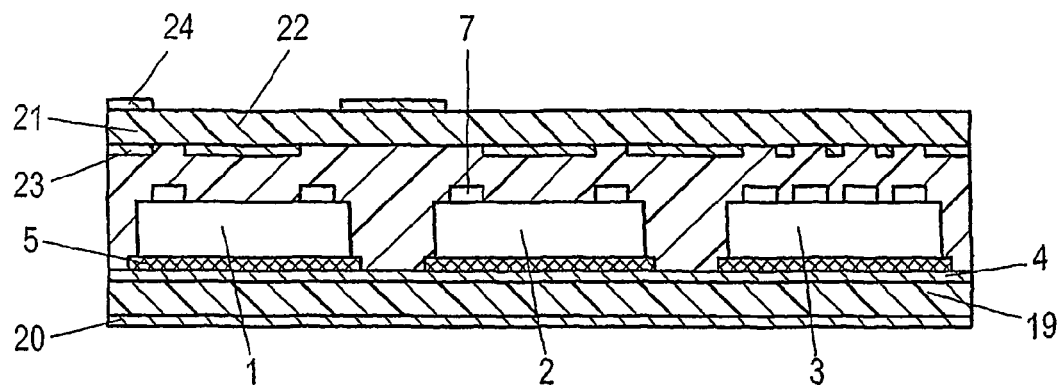
Figure 8:
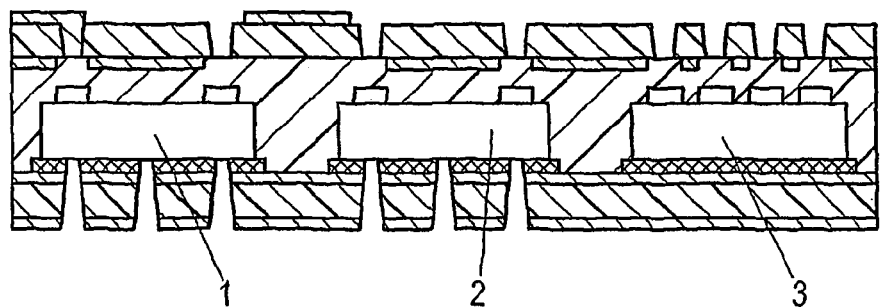
Figure 9:
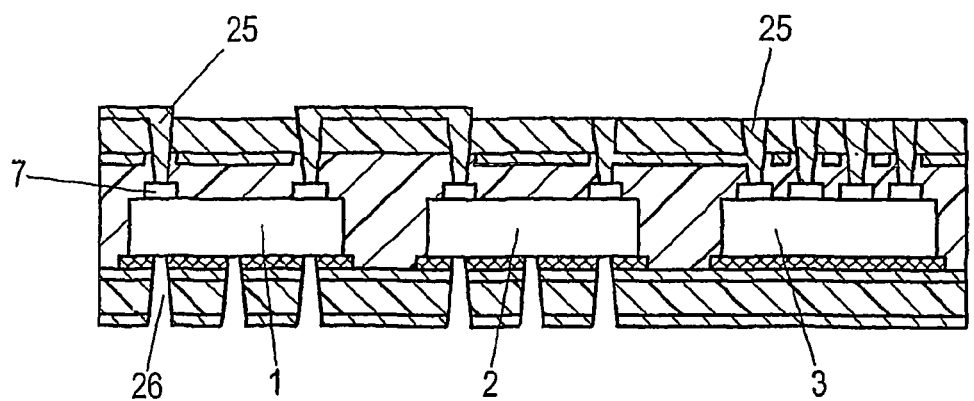

FIG. 3 schematically illustrates a step of patterning the electrically conductive layer after its application or arrangement on the electronic component;

FIG. 4 is a schematic illustration of a further method step of arranging further layers of a printed circuit board according to the invention;

FIG. 5 is a schematic illustration of a printed circuit board according to the invention after having carried out supplementary patterning and formed heat discharge openings;

FIG. 6 is a schematic partial illustration similar to that of FIG. 5, using an electronic component to be integrated, which is provided with contacts or junctions on both of its main surfaces;

FIG. 7, in an illustration similar to that of FIG. 2, depicts a schematic illustration of a modified method step for arranging an electrically conductive layer on a plurality of arranged electronic components to be integrated;

FIG. 8 is a schematic illustration of a further method step according to the modified embodiment, for patterning layers in the region of the fixed or integrated electronic components; and FIG. 9 is a schematic illustration of a further method step according to the modified embodiment while forming contact pads.

DETAILED DESCRIPTION OF PREFERRED EMBODIMENTS

A first process control for producing a printed circuit board for the integration of at least one electronic component into a printed circuit board will be discussed in detail by way of FIGS. 1 to 5.

As is apparent from FIG. 1, a layer 4 supporting a plurality of electronic components 1, 2 and 3 to be integrated in a printed circuit board is provided, which layer 4 is supported by a carrier layer 6 having a comparatively larger thickness during the fixation of the electronic components 1, 2 and 3 via adhesion sites 5.

The adhesive layer 5 used to fix the electronic components 1, 2 and 3 is applied on the layer 4, for instance by screen-printing, roll-coating or the like, in accordance with the arrangement of the components 1, 2 and 3 to be fixed and subsequently integrated. Instead of applying such an adhesive layer in a pattern corresponding to the arrangement of at least one electronic component 1, 2 or 3, or the components 1, 2 and 3 illustrated in FIGS. 1 to 5, the arrangement or application of an adhesive film 5 may also be envisaged, which, following the arrangement of the electronic components 1, 2 and 3 to be fixed, will subsequently be activated, for instance, by photohardening.

The electronic components 1, 2 and 3 to be fixed and integrated each additionally comprise a plurality of contacts 7.

Following the fixation of the electronic components 1, 2 and 3 on the layer 4 by means of the adhesive 5, an electrically conductive layer 8 is subsequently applied or arranged on the electronic components 1, 2 and 3 on their sides facing away from the adhesive 5, wherein, in the embodiment depicted in FIG. 2, the electrically conductive layer 8 is part of a so-called RCC foil, whereby it will be ensured by the additionally provided subregions 9 of plastic or, in general, insulating material that, after the arrangement of the electrically conductive layer 8, clearances between the individual electronic components 1, 2 and 3 and/or in the region of the contact sites 7 will be accordingly filled, wherein additional projections of insulating material are indicated by 10 for distances or clearances between the individual electronic components 1, 2 and 3 to be fixed.

Instead of using an RCC foil as indicated in FIG. 2, which is comprised of the electrically conductive layer 8, which is for instance made of copper, and the insulating material 9, an appropriately embossed or non-embossed prepreg, and optionally separate copper films, may also be used as electrically conductive layer 8 in accordance with the arrangement of the components 1, 2 and 3 to be fixed and integrated as well as their contacts 7.

Immediately upon the application or arrangement of the electrically conductive layer 8 in the region of the contacts or junctions 7 of the electronic components 1, 2 and 3 to be integrated, the carrier layer 6 is removed, whereupon patterning or structuring of the layer 4 and the electrically conducting layer 8 is subsequently effected in accordance with the contact sites 7 of the components 1, 2 and 3 to be integrated and a conducting connection is made between the contact sites 7 and respective subregions of the then patterned electrically conductive layer 8, for instance, by laser-drilling and filling with contacting material, as is illustrated in FIG. 3 and indicated by 27. In the context of the patterning of the electrically conductive layer 8, appropriate conductor tracks for the printed circuit board to be subsequently produced are also formed or provided.

In the illustration according to FIG. 4, it is indicated that, after having contacted the components 1, 2 and 3 to be integrated, as is illustrated in FIG. 3, the further construction of the printed circuit board to be produced, for instance, comprises the application or provision of additional layers both consecutively to the layer 4 supporting the components 1, 2 and 3 to be integrated and consecutively to the electrically conductive layer 8. The further construction of the printed circuit board, for instance, comprises the arrangement or fixation of copper films or copper layers 12 and 13 via an interposed prepreg having, e.g., a thickness of 40 µm, wherein, for instance in the region of the lower side of the printed circuit board to be produced, a copper film 12 having a thickness of less than 25 µm, e.g. about 18 µm, is arranged, while, consecutively to the electrically conductive layer 8 as well as the prepreg 11, a copper film having a thickness similar to that on the lower side, or a thick copper film 13 having a thickness of more than 50 µm, in particular, for instance, 80 µm is likewise arranged.

From the illustration according to FIG. 5, it is apparent that also the additionally applied layers 11, 12 and 13 according to the illustration of FIG. 4 are subjected to further patterning or structuring, wherein laser bores are again provided, for instance, in the region of contactings to be produced, which are, for instance, denoted by 14 in FIG. 5.

To carry off heat from the components 1, 2 and 3 to be integrated, heat-discharging openings 15 are, moreover, provided and indicated in FIG. 5 for the components 1 and 2.

To assist or improve the dissipation of heat, it may, moreover, be provided that the layer 4 used to support the components 1, 2 and 3 to be integrated is made of a metal, e.g. likewise of copper, so as to enable the layer 4, due to the good thermal conductivity of this metallic material, to subsequently ensure an accordingly reliable and enhanced discharge of the heat possibly non-uniformly forming particularly in the region of the components 1 and 2, via the heat discharging openings 15.

In order to further assist the transport of heat, or a more uniform distribution of the heat generated, in particular, by the electronic components 1 and 2, it may, moreover, be provided that the adhesive 5 used for fixation is formed by a thermally conductive adhesive.

From the illustration according to FIG. 6, it is apparent that, in modification to the printed circuit board formed according to FIGS. 1 to 5, in which a plurality of components 1, 2 and 3 are integrated, which are each provided with contacts or junctions 7 on a side facing away from an adhesion site provided by means of an adhesive 5, an electronic component 16 again fixed to a layer 4 via an adhesive 5 is provided, on its side facing away from the adhesive 5, with contacts again denoted by 7 and, on its second main surface, with a lower side 17 made, for instance, of copper, so as to enable contacting of the component 16 both via contacts 7 and via its lower side 17.

Such a configuration, on the one hand, increases the number of contact surfaces or sites and, on the other hand, ensures an improved dissipation of heat via contact pads 18 due to the provision of the copper layer 17 on the lower side of the integrated electronic component 16, which contact pads can thus be used not only for enabling contacting, but optionally also for ensuring an improved dissipation of heat.

From the modified embodiment illustrated in FIGS. 7 to 9, of a printed circuit board to be produced, it is apparent that a plurality of elements or components to be integrated, which, similarly to the embodiment according to FIGS. 1 to 5, are again denoted by 1, 2 and 3, are again each fixed to a layer 4 by means of an adhesive or adhesive site 5.

In the embodiment illustrated in FIG. 7, the carrier layer 6 according to FIG. 1 after its removal is replaced with a further layer of the printed circuit board to be produced, already similarly as in the illustration according to FIG. 4, said further layer being, for instance, again formed by an RCC foil so as to provide for a further conductive or conducting layer 20, in particular copper layer, via an interposed insulating layer 19.

For contacting the contacts or pads of the electronic components 1, 2 and 3 to be integrated, which are again denoted by 7, a multi-layer structure 21 is employed in the embodiment according to FIG. 7, using a pretreated, double-sided core which, in addition to an insulating intermediate layer 22, comprises electrically conductive layers or elements 23 or 24, respectively, on either side, the patterning of which is coordinated with the positioning of individual junctions or contacts 7 of the electronic components 1, 2 and 3 to be embedded.

In order to fill clearances or interspaces between the individual components 1, 2 and 3 to be integrated as well as in the region of the contacts or junctions 7, an insulating material is again used as indicated in FIG. 2.

After having fixed both the double-sided core 21 and the additional layers 19 and 20, patterning, e.g. by laser drilling, is again effected as in the illustration according to FIG. 3 such that the contacts 7 of the components 1, 2 and 3 to be integrated are subsequently contacted while forming respective contact pads 25, as is finally illustrated in FIG. 9.

In a manner similar to the embodiment according to FIGS. 1 to 5, heat discharge openings 26 are again provided for the components 1 and 2, which openings may optionally be filled with appropriate materials supporting heat dissipation.

Instead of the electronic components 1, 2 and 3 represented in the drawings, which are, for instance, configured by a P-MOSFET, a D-MOSFET or an IC or integrated circuit, a variety of other components may be integrated or arranged, wherein such components may be comprised of active or passive components and/or logic components.

In addition to the arrangement of further layers 11, 12, 13 or 19 to 24, which is schematically illustrated in the Figures, it is also possible for the production of a particularly multi-layer printed circuit board to provide further and additional layers according to demands, which can be patterned and mutually coupled as a function of the connections to be produced.

Departing, for instance, from the multi-layer printed circuit boards depicted in FIG. 5, 6 or 9, which are basically only partially completed and in which the schematically indicated components 1, 2 and 3 are integrated, further processing or finishing of such a printed circuit board is performed by using known processing steps or methods.

The invention claimed is:

1. A method for integrating at least one electronic component into a printed circuit board, comprising the following steps:
   providing a layer of a printed circuit board for supporting an electronic component,
   applying an adhesive to a surface of the layer,
   fixing the electronic component on the layer by means of the adhesive,
   after fixing the electronic component to the layer, applying an insulating material to surround the electronic component at all sides of the electronic component except for the side of the electronic component that is fixed to the layer,
   applying or arranging at least one electrically conductive layer on or at the insulating material, on a side or surface of the insulating material that is remote from the adhesive, and
   patterning the electrically conductive layer in accordance with contacts of the electronic component or in accordance with conductor tracks to be formed on the printed circuit board and electrically connecting the contacts of the electronic component to the patterned conductive layer,
   wherein on a side of the electronic component remote from the electrically conductive layer in a region of fixation of the electronic component, at least one opening is formed for exposing a portion of the electronic component and for removal of heat.

2. The method according to claim 1, wherein the layer for supporting the electronic component is applied on a carrier layer or core prior to applying the adhesive.

3. The method according to claim 2, wherein the carrier layer is removed after the fixation of the electronic, component.

4. The method according to claim 1, wherein the adhesive is applied to the surface of the layer in a pattern matched with the arrangement of the electronic component to be fixed.

5. The method according to claim 1, wherein patterning of the conductive layer is performed by laser patterning, photo-patterning.

6. The method according to claim 1, wherein, after patterning of the conductive layer, at least one insulating layer is applied on a surface of the patterned conductive layer remote from the electronic component.

7. The method according to claim 1, wherein at least one conducting or non-conducting layer is additionally applied or arranged to the insulating material.

8. The method according to claim 7, wherein the at least one conducting and/or non-conducting layer is a resin coated copper foil.

9. The method according to claim 1, wherein the layer for supporting the electronic component is formed by a metallic and electrically conductive layer.

10. The method according to claim 1, wherein a thermally conducting or conductive adhesive is used.

11. The method according to claim 1, wherein an electronic component is used, which, on opposite main surfaces, is each provided with a plurality of contacts to be contacted with the electrically conductive layers.

12. The method according to claim 1, wherein the electronic component is tested for the electronic component's functionality immediately upon patterning of the electrically conductive layer.

13. The method according to claim 1, wherein the insulating material is a prepreg film and/or a resin.

* * * * *

UNITED STATES PATENT AND TRADEMARK OFFICE
CERTIFICATE OF CORRECTION

| | | |
|---|---|---|
| PATENT NO. | : 8,789,271 B2 | Page 1 of 1 |
| APPLICATION NO. | : 12/736942 | |
| DATED | : July 29, 2014 | |
| INVENTOR(S) | : Günther Weichslberger et al. | |

It is certified that error appears in the above-identified patent and that said Letters Patent is hereby corrected as shown below:

On the Title Page
Please replace Item (73) Assignee "AT & S Austria Technologies & Systemtechnik Aktiengesellschaft, Leoben-Hinterberg (AT)" WITH --AT & S Austria Technologie & Systemtechnik Aktiengesellschaft, Leoben-Hinterberg (AT)--

Signed and Sealed this
Twenty-eighth Day of October, 2014

Michelle K. Lee
*Deputy Director of the United States Patent and Trademark Office*